United States Patent
Galy et al.

(10) Patent No.: US 8,179,646 B2
(45) Date of Patent: May 15, 2012

(54) INTEGRATED CIRCUIT PROVIDED WITH A LARGE AREA PROTECTION AGAINST ELECTROSTATIC DISCHARGES

(75) Inventors: Philippe Galy, Le Touvet (FR); Christophe Entringer, Brignoud (FR)

(73) Assignee: STMicroelectronics SA, Montrouge (FR)

( * ) Notice: Subject to any disclaimer, the term of this patent is extended or adjusted under 35 U.S.C. 154(b) by 195 days.

(21) Appl. No.: 12/759,877

(22) Filed: Apr. 14, 2010

(65) Prior Publication Data
US 2010/0271740 A1  Oct. 28, 2010

(30) Foreign Application Priority Data

Apr. 27, 2009  (FR) ..................................... 09 52753
Feb. 15, 2010  (EP) ..................................... 10153640

(51) Int. Cl.
*H02H 3/22* (2006.01)
(52) U.S. Cl. ......................................... 361/56; 361/111
(58) Field of Classification Search .................... 361/56, 361/111
See application file for complete search history.

(56) References Cited

U.S. PATENT DOCUMENTS

| 6,144,542 | A | 11/2000 | Ker et al. | |
|---|---|---|---|---|
| 7,518,841 | B2 * | 4/2009 | Chuang et al. | 361/56 |
| 2003/0146474 | A1 | 8/2003 | Ker et al. | |
| 2008/0285199 | A1 | 11/2008 | Deutschmann et al. | |
| 2009/0195951 | A1 * | 8/2009 | Sorgeloos et al. | 361/56 |

* cited by examiner

*Primary Examiner* — Danny Nguyen
(74) *Attorney, Agent, or Firm* — The Noblitt Group PLLC

(57) ABSTRACT

An integrated circuit protected against electrostatic discharges, including: first and second supply rails; first and second intermediary rails normally connected to the first and second supply rails; inverters formed of a P-channel MOS transistor series-connected to an N-channel MOS transistor, the sources of the P-channel and N-channel MOS transistors being respectively connected to the first and second supply rails and the bodies of the P-channel and N-channel transistors being respectively connected to the first and second intermediary rails; a positive overvoltage detector between the first and second supply rails; and a switch for connecting the first and second intermediary rails to the second and first supply rails when a positive overvoltage is detected.

5 Claims, 3 Drawing Sheets

INTEGRATED CIRCUIT PROVIDED WITH A LARGE AREA PROTECTION AGAINST ELECTROSTATIC DISCHARGES

BACKGROUND OF THE INVENTION

1. Field of the Invention

The present invention relates to means for protecting integrated circuits against electrostatic discharges.

2. Discussion of the Related Art

FIG. 1 is a simplified top view of an integrated circuit chip. The integrated circuit comprises a central portion 1 connected to an assembly of metal pads 3 arranged at the chip periphery and intended to ensure connections to the outside. Central portion 1 comprises all the components enabling the integrated circuit to perform desired functions. Some of pads 3 are intended to receive high ($V_{DD}$) and low ($V_{SS}$) supply voltages. High and low supply rails 5 and 7 are generally provided all around the circuit. The other pads 3 are especially intended for receiving and/or for providing input-output signals. The entire circuit is covered with an insulating layer which only enables to access to terminals connected to pads 3, and may be placed in a package comprising lugs connected to pads 3 or balls connected to these pads.

Such a circuit generally receives and/or provides signals of low voltage level (for example, from 0.6 to 3 V) and low current intensity (for example, from 1 µA to 10 mA), and is likely to be damaged when overvoltages or overintensities occur between pads of the package. Overvoltages may occur during the manufacturing or assembly phase, before the circuit is assembled in a device (for example, on a printed circuit board), in case of electrostatic discharges linked to the manipulation of the circuits by tools or by hand. Such overvoltages may reach several thousands of volts and destroy elements of the circuit.

It is thus provided to associate with each pad 3 a protection structure which generally takes up a crown 9 arranged between pads 3 and central portion 1 of the chip. The protection structure must be able to rapidly drain off large currents, likely to appear when an electrostatic discharge occurs between two pads or two terminals of the package.

FIG. 2 shows an example of a protection structure 10, associated with an input-output pad 3 of an integrated circuit. A diode 11 is forward-connected between pad 3 and high supply rail 5. A diode 13 is reverse-connected between pad 3 and low supply rail 7. A MOS transistor 15, used as a switch, is connected between high and low supply rails 5 and 7. An overvoltage detection circuit 17, connected in parallel with MOS transistor 15, provides this transistor with a trigger signal. Overvoltage detection circuit 17 may for example be an edge detector comprising a resistor in series with a capacitor, the connection node between the resistor and the capacitor switching state in the presence of an abrupt overvoltage. MOS transistor 15 especially comprises a parasitic diode 16 forward-connected between rail 7 and rail 5.

The operation of the protection structure in case of an overvoltage occurring on an input-output pad (now simply called "pad") or on a pad connected to a supply rail (now simply called "rail") will be indicated hereafter.

In normal operation, when the chip is powered, the signals on pads 3 and rails 5 and 7 are such that diodes 11 and 13 conduct no current and detection circuit 17 turns off MOS transistor 15.

In case of a positive overvoltage between high and low supply rails 5 and 7, circuit 17 turns on transistor 15, which enables to remove the overvoltage.

In case of a negative overvoltage between high and low supply rails 5 and 7, diode 16 turns on and the overvoltage is removed.

In case of a positive overvoltage between a pad 3 and high supply rail 5, diode 11 turns on and the overvoltage is removed.

In case of a negative overvoltage between pad 3 and rail 5, circuit 17 turns on transistor 15, and the overvoltage is removed through transistor 15 and diode 13.

In case of a positive overvoltage between a pad 3 and low supply rail 7, diode 11 turns on and the positive overvoltage is transferred onto high supply rail 5, which corresponds to the above-discussed case of a positive overvoltage between rails 5 and 7.

In case of a negative overvoltage between a pad 3 and low supply rail 7, diode 13 turns on and the overvoltage is removed.

In case of a positive or negative overvoltage between two pads 3, diodes 11 or 13 associated with the concerned pads turn on, and the overvoltage is transferred to high and low supply rails 5 and 7. This corresponds to one of the above-discussed overvoltage cases.

A disadvantage of such a protection structure lies in the fact that, to be able to drain off the currents induced by electrostatic discharges, diodes 11 and 13 and transistor 15 must have a large surface area (typically, a junction perimeter of 200 µm per diode and a gate width of 1,000 µm per transistor). As a result, crown 9 (FIG. 1) takes up a significant silicon surface area, to the detriment of central portion 1 of the chip. Further, due to its large size, MOS transistor 15 in the off state is crossed by significant leakage currents, which increases the circuit consumption.

SUMMARY OF THE INVENTION

A feature of an embodiment of the present invention is to provide an integrated circuit with protection against electrostatic discharges, where this protection does not or only slightly increases the silicon surface area taken up by the circuit.

Another feature of an embodiment of the present invention is to provide such a protection which does not disturb the proper operation of the circuit in normal conditions of use.

A still further feature of an embodiment of the present invention is to provide such a protection which is easy to implement.

Generally, an embodiment of the present invention provides to use, in case of an overvoltage, inverters existing in the central portion of the integrated circuit as a path for removing the overvoltage.

Thus, an embodiment of the present invention provides an integrated circuit protected against electrostatic discharges, comprising: first and second supply rails; first and second intermediary rails normally connected to the first and second supply rails; inverters formed of a P-channel MOS transistor series-connected to an N-channel MOS transistor, the sources of the P- and N-channel MOS transistors being respectively connected to the first and second supply rails and the bodies of the P- and N-channel MOS transistors being respectively connected to the first and second intermediary rails; a positive overvoltage detector between the first and second supply rails; and a switch for connecting the first and second intermediary rails to the second and first supply rails when a positive overvoltage is detected.

According to an embodiment of the present invention, the assembly of the positive overvoltage detector and of the switch comprises: a resistor and a capacitor having a common connection node, series-connected between the supply rails; a first inverter in series with a second inverter, the input of the first inverter being connected to said connection node, the first intermediary rail being connected to the output of the second inverter and the second intermediary rail being connected to the output of the first inverter; a first diode forward-connected between the first intermediary rail and the first power supply rail; and a second diode reverse-connected between the second intermediary rail and the second supply rail.

According to an embodiment of the present invention, the first and second diodes are formed of the parasitic diodes present in the first and second inverters.

According to an embodiment of the present invention, from 50 to 95% of the total surface area are taken up by the inverters.

An embodiment of the present invention provides a method for protecting against overvoltages an integrated circuit comprising first and second supply rails, first and second intermediary rails, and inverters formed of a P-channel MOS transistor series-connected with an N-channel MOS transistor, the sources of the P- and N-channel MOS transistors being respectively connected to the first and second supply rails and the bodies of the P- and N-channel MOS transistors being respectively connected to the first and second intermediary rails, the method comprising the steps of: detecting possible overvoltages between the first and second supply rails when the integrated circuit is not supplied; connecting the first intermediary rail to the first supply rail and the second intermediary rail to the second supply rail when the integrated circuit is supplied or when the integrated circuit is not supplied and a negative overvoltage is detected; and connecting the first intermediary rail to the second supply rail and the second intermediary rail to the first supply rail when the circuit is not supplied and a positive overvoltage is detected.

The foregoing features and benefits of the present invention will be discussed in detail in the following non-limiting description of specific embodiments in connection with the accompanying drawings.

DETAILED DESCRIPTION

Figure 1:
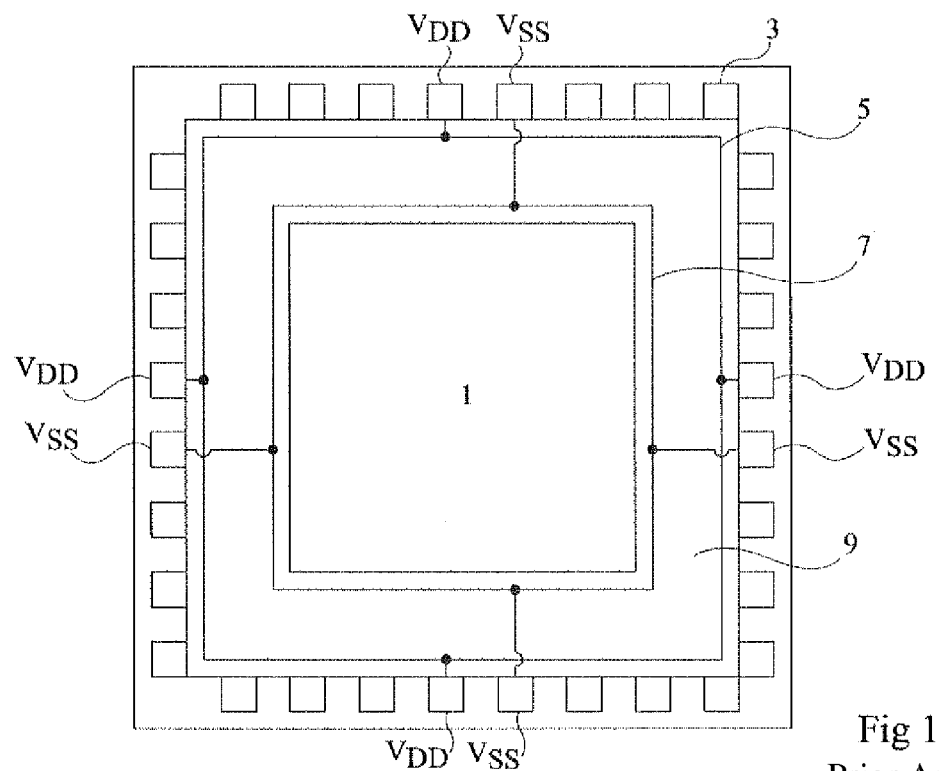
FIG. 1, previously described, is a simplified top view of an integrated circuit chip.

For clarity, the same elements have been designated with the same reference numerals in the different drawings and, further, as usual in the representation of integrated circuits, the various drawings are not to scale.

An inverter is an elementary components of logic integrated circuits made in CMOS (Complementary Metal Oxide Semiconductor) technology. Generally, central portion 1 (FIG. 1) of an integrated circuit chip especially comprises inverters connected to high and low supply rails 5 ($V_{DD}$) and 7 ($V_{SS}$). The inverters are combined together to performed desired functions. Generally, from 50 to 95% of the silicon surface area of the central portion of an integrated circuit is taken up by inverters.

Figure 3A:
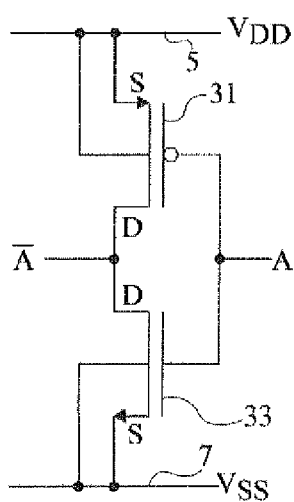
FIG. 3A schematically shows an inverter circuit.

FIG. 3A shows the diagram of an inverter. The sources (S) of a P-channel MOS transistor 31 and of an N-channel MOS transistor 33 are respectively connected to high and low supply rails 5 ($V_{DD}$) and 7 ($V_{SS}$). The drains (D) of transistors 31 and 33 are interconnected at an output node $\overline{A}$. The bodies of transistors 31 and 33 are connected to their sources, that is, respectively to rails 5 and 7. The gates of transistors 31 and 33 are interconnected at an input node A. When input signal A is in the high state, P-channel transistor 31 is off, N-channel transistor 33 is on, and output signal $\overline{A}$ is at the low supply voltage (low state). When input signal A is in the low state, transistor 31 is on, transistor 33 is off, and output signal $\overline{A}$ is at the high supply voltage (high state).

Figure 3B:
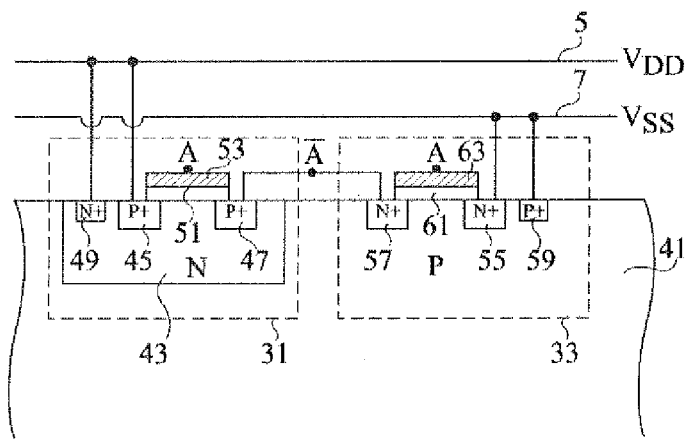
FIG. 3B shows a cross-section view of an embodiment of an inverter.

FIG. 3B is a cross-section view of an embodiment of an inverter. The structure is formed in a lightly-doped P-type silicon substrate 41, where the substrate may be solid or be the upper layer of a so-called SOI structure. A P-channel MOS transistor 31 is formed in a lightly-doped N-type well which forms body 43 of transistor 31. Two heavily-doped P-type regions form source 45 and drain 47 of the transistor. A body contact region 49, with a high N-type doping level, is formed at the surface of body 43. An insulating layer 51, covering the surface ranging between regions 45 and 47, is covered with a conductive gate 53. An N-channel MOS transistor 33, close to transistor 31, is formed in substrate 41. Two heavily-doped N-type regions form source 55 and drain 57 of transistor 33. A body contact region 59 of high P-type doping level is formed at the surface of substrate 41. An insulating layer 61, covering the surface comprised between regions 55 and 57, is covered with a conductive gate 63.

Source 45 and body contact region 49 of transistor 31 are connected to high supply rail 5 ($V_{DD}$). Source 55 and body contact region 59 of transistor 33 are connected to low supply rail 7 ($V_{SS}$). Gates 53 and 63 of transistors 31 and 33 receive input signal A of the inverter. Drains 47 and 57 of transistors 31 and 33 are connected together and provide output signal $\overline{A}$ of the inverter.

Generally, it is here provided to use the inverters existing in the central portion of a logic integrated circuit as a path for draining off electrostatic discharges. Since these inverters typically take up more than 50% and up to 95% of the silicon surface area of the central portion of a circuit, a significant silicon surface area will then be available to dissipate electrostatic discharges. An embodiment of the present invention provides, in case of an overvoltage, a specific mode of connection of the inverters to the supply rails, enabling to remove the overvoltage.

Figure 4:
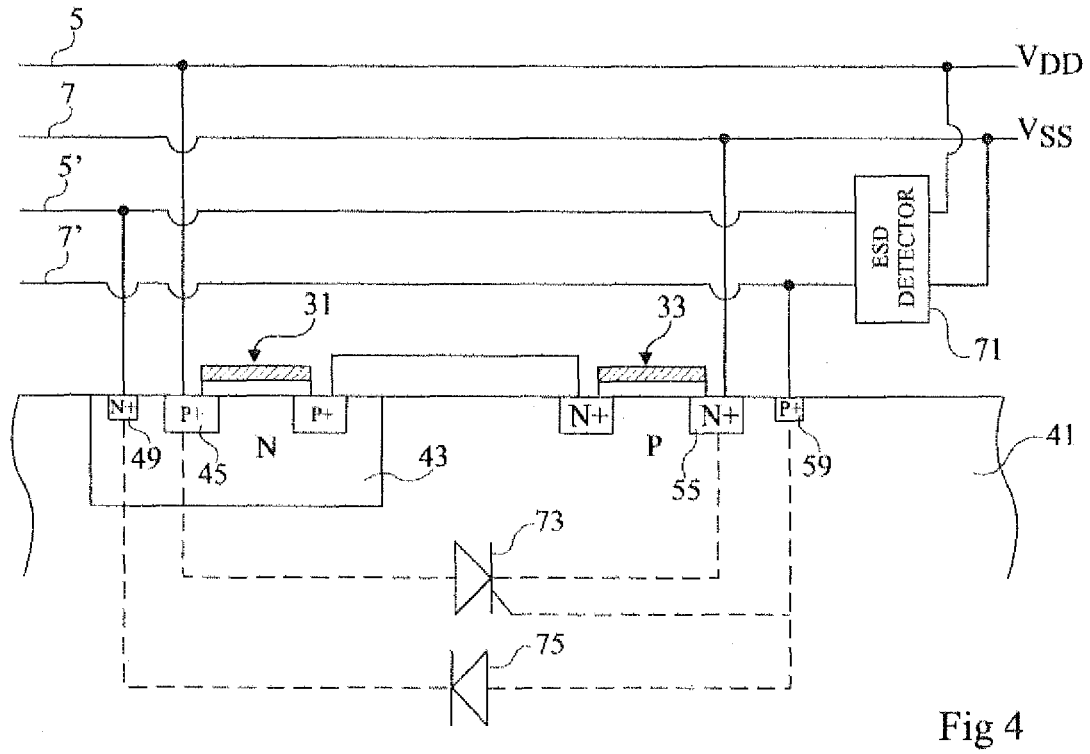
FIG. 4 shows a structure of protection against overvoltages using an inverter of the integrated circuit as a protection element.

FIG. 4 illustrates the use of an inverter as an element of protection against overvoltages. Conventionally, source 45 of P-channel MOS transistor 31 is connected to high supply rail 5 ($V_{DD}$) and source 55 of N-channel MOS transistor 33 is connected to low supply rail 7 ($V_{SS}$). Intermediary rails 5' and 7' are further provided. Body contact region 49 of transistor 31 is connected to intermediary rail 5' instead of being connected to supply rail 5 for a conventional inverter, and body contact region 59 of transistor 33 is connected to intermediary rail 7' instead of being connected to supply rail 7.

A detection and switching circuit 71, connected to supply rails 5 and 7 on the one hand and to intermediary rails 5' and 7' on the other hand, is provided for:

detecting a possible overvoltage between rails 5 and 7 when the integrated circuit is not supplied, connecting rail 5' to rail 5 and rail 7' to rail 7 when the integrated circuit is supplied or when the circuit is not supplied and a negative overvoltage is detected, and connecting rail 5' to rail 7 and rail 7' to rail 5 when the circuit is not supplied and a positive overvoltage is detected.

Thus, in normal operation, when the integrated circuit is supplied, body contact regions 49 and 59 of transistors 31 and 33 are connected to rails 5 and 7. The inverter operation is thus not disturbed.

It should be noted that transistors 31 and 33 define, between their respective sources 45 and 55, a parasitic PNPN thyristor 73, corresponding to regions 45-43-41-55. Thyristor 73 has a cathode gate which corresponds to P-type body contact region 59. Transistors 33 and 31 further define, between their respective body contact regions 59 (P-type) and 49 (N-type), a diode 75.

In case of a positive overvoltage between rails 5 and 7 when the integrated circuit is not supplied, rail 5' is connected to rail 7 and rail 7' is connected to rail 5. Thus, anode 45 of thyristor 73 is connected to positive rail 5 and cathode 55 of thyristor 73 is connected to negative rail 7. Thyristor 73 is thus biased in the direction in which it can be conductive and it is made conductive by its cathode gate 59 being connected to rail 7', which is then positive. The overvoltage is then removed by the thyristor.

In case of a negative overvoltage between rails 5 and 7, rail 5' is connected to rail 5 and rail 7' is connected to rail 7. Thus, anode 59 of diode 75 substantially receives the voltage, here positive, of rail 7 and cathode 49 of diode 75 substantially receives the voltage, here negative, of rail 5. Diode 75 is thus made conductive and removes the overvoltage.

Figure 5:
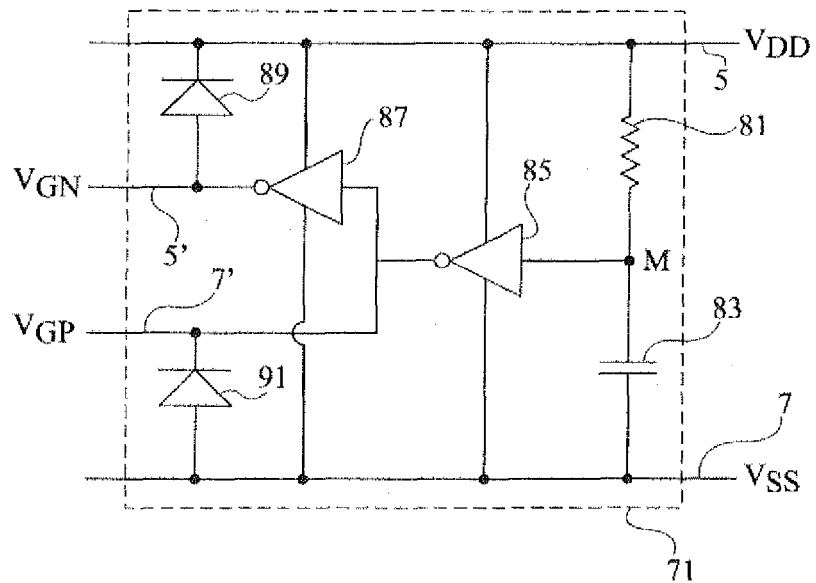
FIG. 5 shows in further detail the overvoltage detection and rail switching circuit of FIG. 4.

FIG. 5 details a possible embodiment of an electrostatic discharge detection and switching circuit. An edge detector, formed of a resistor 81 in series with a capacitor 83, is connected between supply rails 5 and 7. A node M between resistor 81 and capacitor 83 is connected to the input of an inverter 85. The output of inverter 85 is connected to the input of an inverter 87 and to intermediary rail 7'. Output inverter 87 is connected to intermediary rail 5'. Inverters 85 and 87 are supplied by supply rails 5 and 7. A diode 89 is forward-connected between the output of inverter 87 and rail 5. A diode 91 is reverse-connected between the output of inverter 85 and rail 7.

In normal operation, when the circuit is supplied, node M is in a high state. Rail 5' thus is in a high state, that is, substantially at voltage $V_{DD}$ of high supply rail 5. Rail 7' is in a low state, that is, substantially a voltage $V_{SS}$ of low supply rail 7.

When the integrated circuit is not supplied, node M is in a low state. Since inverters 85 and 87 are not supplied, rails 5' and 7' are in an undetermined state.

If a positive overvoltage occurs between rails 5 and 7, node M remains in a low state. The overvoltage provides a power supply to inverters 85 and 87. Rail 5' is thus taken to a low state, that is, substantially to the same negative voltage as rail 7. Rail 7' is taken to a high state, that is, substantially to the same positive voltage as rail 5. Thus, the overvoltage is removed by thyristor 73 as described in relation with FIG. 4.

If a negative overvoltage occurs between rails 5 and 7, node M remains in a low state. Diodes 89 and 91 are made conductive. Rail 5' is thus substantially taken to the same voltage (here, negative) as rail 5 and rail 7' is taken to substantially the same voltage (here positive) as rail 7. Thus, the overvoltage is removed by diode 75 as described in relation with FIG. 4.

For a better understanding, the detection and switching circuit described hereabove comprises two diodes 89 and 91. It should be noted that the functions of these diodes may be performed by the parasitic diodes of the MOS transistors forming inverters 85 and 87.

Figure 6A:
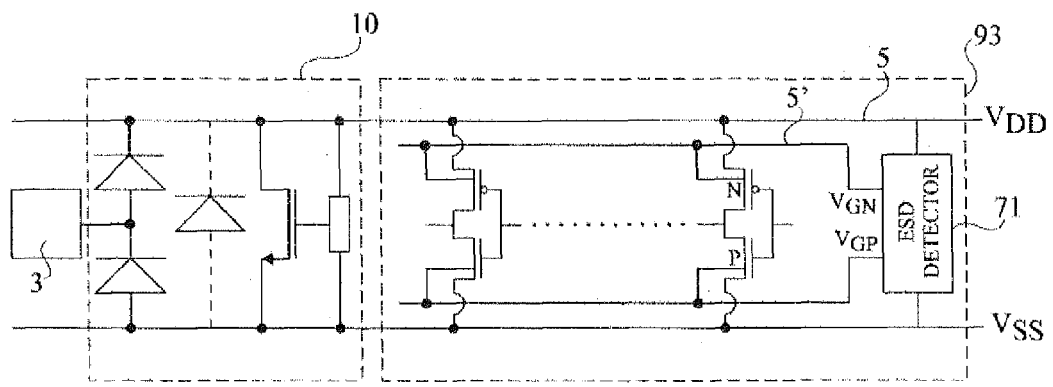
FIG. 6A shows a portion of an integrated circuit in which the inverters are used as elements of protection against overvoltages.

FIG. 6A schematically shows a portion of an integrated circuit in which inverters are used as elements of protection against overvoltages. A conventional protection structure 10, associated with an input-output pad 3, is comprised between the pad line and central portion 1 (FIG. 1). A portion 93 of central portion 1 especially comprises inverters connected between high and low supply rails 5 ($V_{DD}$) and 7 ($V_{SS}$). The N-type body regions of the inverters are connected to an intermediary rail 5' and the P-type body regions are connected to an intermediary rail 7'. An electrostatic discharge detection and switching circuit 71, such as described hereabove in relation with FIG. 5, is connected to supply rails 5 and 7, on the one hand, and to intermediary rails 5' and 7', on the other hand. When the integrated circuit is supplied, intermediary rails 5' and 7' are respectively connected to supply rails 5 and 7 so that the inverters behave normally.

Figure 6B:
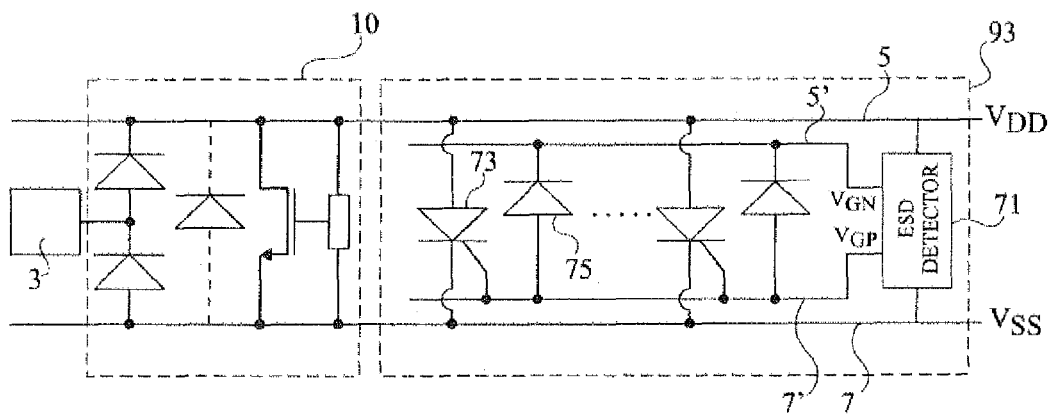
FIG. 6B schematically illustrates the behavior of the circuit of FIG. 6A in case of an overvoltage.

FIG. 6B schematically shows the behavior, in case of an overvoltage, of the integrated circuit portion described in FIG. 6A.

If the overvoltage between rails 5 and 7 is positive, intermediary rails 5' and 7' are respectively connected to rails 7 and 5 (by circuit 71). Thus, thyristors 73 and diodes 75, intrinsic to the inverters, are turned on and the overvoltage is removed.

If the overvoltage is negative, intermediary rails 5' and 7' are respectively connected to rails 5 and 7 (by circuit 71). Thus, diodes 75, intrinsic to the inverters, are made conductive and the overvoltage is removed.

According to a benefit of the present invention, existing inverters of the integrated circuit are used as elements of protection against electrostatic discharges.

According to another benefit of the present invention, the inverters generally take up most of the silicon surface area of an integrated circuit, and a significant silicon surface area is thus available to remove overvoltages.

According to still another benefit of the present invention, the elements necessary to the use of the inverters of the integrated circuit as elements of protection against overvoltages only comprise rails 5' and 7' and detector 71 and take up a negligible surface area.

Figure 2:
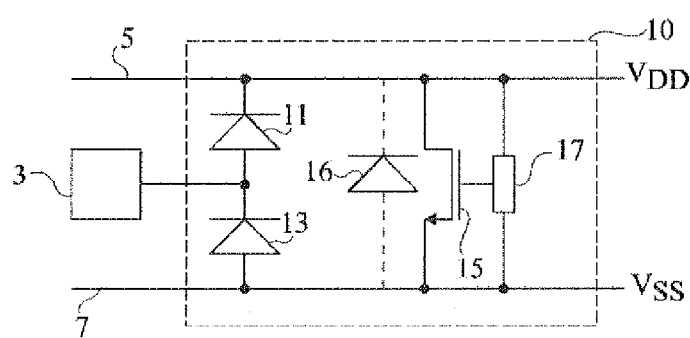
FIG. 2, previously described, shows an example of a structure of protection against overvoltages associated with a pad of an integrated circuit.

Specific embodiments of the present invention have been described. Various alterations and modifications will occur to those skilled in the art. In particular, the present invention is not limited to the sole overvoltage detection and switching circuit described hereabove in relation with FIG. 5. It will be within the abilities of those skilled in the art to form other circuits, capable of detecting an overvoltage of given polarity and of performing a connection switching as a response to this detection. It will be within the abilities of those skilled in the art to choose to use the present invention either to reinforce prior art solutions or, if the surface area taken up by the inverters is large enough, as a sole means for removing overvoltages between supply rails. For example, it will be within the abilities of those skilled in the art, in this last case, to do without the MOS transistor of the conventional protection structure described hereabove in relation with FIG. 2. Moreover, positive voltages and negative voltages have been mentioned in the description of an embodiment of the present invention, and it should of course be understood that "positive" designates voltages greater than the voltages designated as "negative", and conversely. It will be within the abilities of those skilled in the art to implement the desired operation whatever the considered voltage values.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit protected against electrostatic discharges, comprising:
    first and second supply rails;
    first and second intermediary rails normally connected to the first and second supply rails;
    inverters, existing for the normal operation of the integrated circuit, formed of a P-channel MOS transistor series-connected to an N-channel MOS transistor, the sources of the P- and N-channel MOS transistors being respectively connected to the first and second supply rails and the bodies of the P- and N-channel MOS transistors being respectively connected to the first and second intermediary rails;
    a positive overvoltage detector between the first and second supply rails; and
    a switch for connecting the first and second intermediary rails to the second and first supply rails when a positive overvoltage is detected.

2. The integrated circuit of claim 1, wherein the assembly of the positive voltage detector and of the switch comprises:
    a resistor and a capacitor having a common connection node, series-connected between the supply rails;
    a first inverter in series with a second inverter, the input of the first inverter being connected to said connection node, the first intermediary rail being connected to the output of the second inverter and the second intermediary rail being connected to the output of the first inverter;
    a first diode forward-connected between the first intermediary rail and the first power supply rail; and
    a second diode reverse-connected between the second intermediary rail and the second supply rail.

3. The integrated circuit of claim 2, wherein the first and second diodes are formed of the parasitic diodes present in the first and second inverters.

4. The integrated circuit of claim 1, wherein from 50 to 95% of the total surface area are taken up by the inverters.

5. A method for protecting against overvoltages in an integrated circuit having first and second supply rails, first and second intermediary rails, and inverters formed of a P-channel MOS transistor series-connected to an N-channel MOS transistor, the sources of the P-channel and N-channel MOS transistors being respectively connected to the first and second supply rails and the bodies of the P-channel and N-channel MOS transistors being respectively connected to the first and second intermediary rails, the method comprising the steps of:
    detecting possible overvoltages between the first and second supply rails when the integrated circuit is not supplied;
    connecting the first intermediary rail to the first supply rail and the second intermediary rail to the second supply rail when the integrated circuit is supplied or when the integrated circuit is not supplied and a negative overvoltage is detected; and
    connecting the first intermediary rail to the second supply rail and the second intermediary rail to the first supply rail when the circuit is not supplied and a positive overvoltage is detected.

* * * * *